(12) United States Patent
Ikawa et al.

(10) Patent No.: US 10,797,032 B2
(45) Date of Patent: Oct. 6, 2020

(54) LIGHT-EMITTING ELEMENT MODULE

(71) Applicant: SHARP KABUSHIKI KAISHA, Sakai, Osaka (JP)

(72) Inventors: Yuta Ikawa, Sakai (JP); Hiroyoshi Higashisaka, Sakai (JP); Tsuyoshi Ono, Sakai (JP); Keiichi Sawai, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/371,727

(22) Filed: Apr. 1, 2019

(65) Prior Publication Data
US 2019/0333902 A1    Oct. 31, 2019

(30) Foreign Application Priority Data
Apr. 25, 2018   (JP) .................................. 2018-084447

(51) Int. Cl.
| | |
|---|---|
| *H01L 25/16* | (2006.01) |
| *H01L 33/62* | (2010.01) |
| *H01L 25/075* | (2006.01) |
| *H01L 23/522* | (2006.01) |
| *H01L 33/60* | (2010.01) |
| *H01L 33/64* | (2010.01) |
| *H01L 49/02* | (2006.01) |
| *H01L 23/528* | (2006.01) |

(52) U.S. Cl.
CPC .......... *H01L 25/167* (2013.01); *H01L 23/528* (2013.01); *H01L 23/5228* (2013.01); *H01L 25/0753* (2013.01); *H01L 28/20* (2013.01); *H01L 33/60* (2013.01); *H01L 33/62* (2013.01); *H01L 33/647* (2013.01)

(58) Field of Classification Search
None
See application file for complete search history.

(56) References Cited

U.S. PATENT DOCUMENTS

| | | | |
|---|---|---|---|
| 8,089,156 B2 | 1/2012 | Nagai | |
| 2018/0358339 A1* | 12/2018 | Iguchi | .................. G09G 3/3233 |
| 2019/0057955 A1* | 2/2019 | Moosburger | .......... G09F 9/3026 |
| 2019/0385513 A1* | 12/2019 | Iguchi | ................. H01L 27/1214 |

FOREIGN PATENT DOCUMENTS

| | | |
|---|---|---|
| JP | 2005-236128 A | 9/2005 |
| JP | 2008-159950 A | 7/2008 |
| JP | 2009-124099 A | 6/2009 |
| TW | 201742236 A | 12/2017 |

* cited by examiner

*Primary Examiner* — J. E. Schoenholtz
(74) *Attorney, Agent, or Firm* — ScienBiziP, P.C.

(57) ABSTRACT

In a light-emitting element module, at least two or more first electrodes of a first substrate that includes a circuit element are joined to at least two or more light-emitting elements. The first substrate includes a first wiring line to an n-th wiring line (n is an integer of 2 or more) that are formed into layers in order from the at least two or more light-emitting elements in a thickness direction of the first substrate. The first wiring line that is located in one of the layers of the first substrate nearest to the at least two or more light-emitting elements is formed at least in an interelectrode region between the adjacent first electrodes of the first substrate in a plan view.

6 Claims, 11 Drawing Sheets

US 10,797,032 B2

LIGHT-EMITTING ELEMENT MODULE

BACKGROUND

1. Field

The present disclosure relates to a light-emitting element module in which first electrodes of a first substrate that includes a circuit element and light-emitting elements are joined to each other.

2. Description of the Related Art

In a light-emitting element module, first electrodes of a first substrate that includes a circuit element and second electrodes of light-emitting elements that are disposed on a second substrate are joined to each other. For example, in the first substrate, wiring lines are formed in layers in order from the light-emitting elements in the thickness direction of the first substrate. Interlayer insulating layers are typically formed between the adjacent wiring lines in the thickness direction of the first substrate in which the layers of the wiring lines are formed.

In some processes for manufacturing the light-emitting element module, the first substrate and the second substrate are bonded to each other with a load of a predetermined pressure applied to the second substrate to join the first electrodes of the first substrate and the second electrodes with certainty. The load is also applied to the first substrate.

Incidentally, a load per unit area when the first electrodes of the first substrate and the second electrodes are joined to each other increases as the areas of the second electrodes of the light-emitting elements decrease, or as the number of connections between the first electrodes of the first substrate and the second electrodes increases. For example, the area of each second electrode is less than 10 square micrometres, and the load is equal to or more than 20 to 100 times a conventional load per unit area during joining.

In this case, a force acts on the wiring lines in the thickness direction (vertical direction) of the first substrate and in the direction (horizontal direction) perpendicular to the thickness direction of the first substrate due to the load during joining depending on sparseness and denseness of the wiring lines of the first substrate.

FIG. 16 schematically illustrates a state where a pressure is applied to first wiring lines 110(1) when light-emitting elements 210 are bonded to a first substrate 100 with a schematic sectional view. FIG. 17 illustrates a pressure resolution diagram in which the pressure that is applied to the first wiring lines 110(1) is resolved. In FIG. 16, reference character 200a denotes electrodes of the light-emitting elements 210, and reference character 100a denotes electrodes of the first substrate 100.

As illustrated in FIG. 16, forces F act in the directions of arrows illustrated on the left-hand side in FIG. 16 due to the load when the light-emitting elements 210 are bonded to the first substrate 100. Consequently, as illustrated on the right-hand side in FIG. 16, the first wiring lines 110(1), which are located in the layer of the first substrate 100 nearest to the light-emitting elements, bend due to the forces F. As illustrated in FIG. 17, the force F is resolved into a first component force Fx in the direction X (horizontal direction) perpendicular to the thickness direction Y (vertical direction) of the first substrate 100 and a second component force Fy in the thickness direction Y.

The first component force Fx and the second component force Fy that act as illustrated in FIG. 16 and FIG. 17 cause problems in that a micro crack of each interlayer insulating layer and damage of an underlying circuit (a circuit 130) in the first substrate 100 occur, a failure of circuit operation occurs, and reliability decreases. For example, in the case where a second substrate 200 that includes the light-emitting elements 210 (specifically, light-emitting diodes, or light-emitting elements such as LEDs) is bonded to the first substrate 100 that includes the circuit 130 (specifically, a large-scale integrated circuit, or a circuit such as a LSI circuit) that includes circuit elements (specifically, transistors), a failure illustrated in FIG. 18 occurs. This is remarkable particularly in the case where the circuit elements are disposed right below connections between the electrodes of the first substrate and the second electrodes of the light-emitting elements.

FIG. 18 schematically illustrates a state where the second substrate 200 is bonded to the first substrate 100 with a schematic sectional view for an existing light-emitting element module 300. The first substrate 100 includes the circuit 130 that includes circuit elements 130a. The second substrate 200 includes the light-emitting elements 210. In FIG. 18, reference character 100a denotes the electrodes of the first substrate 100, reference character 100b denotes parts of terminals of the circuit 130 of the first substrate 100, reference character 110(1) denotes the first wiring lines of the first substrate 100, reference character 110(2) denotes second wiring lines of the first substrate 100, reference character 110(3) denotes third wiring lines of the first substrate 100, reference character 120 denotes interlayer insulating layers of the first substrate 100, reference character 140 denotes a protective layer of the first substrate 100, and reference character 200a denotes electrodes of the second substrate 200 (the light-emitting elements 210).

As illustrated in FIG. 18, in the case where the circuit elements 130a are formed right below the light-emitting elements 210, and in the case where gate polysilicon layers and metal layers of the circuit elements 130a are partly formed, not only the first wiring lines 110(1) bend but also a stress is applied to the light-emitting elements 210 and the circuit 130, due to the load when the second substrate 200 is bonded to the first substrate 100. In extreme cases, there is a concern that the light-emitting elements 210 are broken, and the circuit 130 is broken.

Regarding this issue, Japanese Unexamined Patent Application Publication No. 2008-159950 discloses that an inorganic, thin layer that is composed of an inorganic material extends from an edge of a surface of each interlayer insulating layer to a side surface thereof and reaches a surface of a semiconductor substrate. Japanese Patent No. 4267481 discloses that vias right below a pad on the uppermost layer are formed into a lattice pattern. Japanese Unexamined Patent Application Publication No. 2009-124099 discloses that a dummy pattern that has no electric potential is formed between a pad metal and a wiring line metal in a region that includes a portion extending in the vertical direction from an edge of a barrier metal.

However, none of the structures in Japanese Unexamined Patent Application Publication No. 2008-159950, Japanese Patent No. 4267481, and Japanese Unexamined Patent Application Publication No. 2009-124099 has a countermeasure for a failure (for example, the circuit of the first substrate is broken or the light-emitting elements are broken) that occurs due to the load when the first substrate and the second substrate are bonded to each other.

In view of this, it is desirable to provide a light-emitting element module in which first electrodes of a first substrate that includes a circuit element and light-emitting elements are joined to each other, and the light-emitting element module can effectively inhibit a failure (for example, a circuit of the first substrate is broken or the joined light-emitting elements are broken) that occurs due to the load when the first substrate and the light-emitting elements are bonded to each other.

SUMMARY

A light-emitting element module according to the present disclosure includes at least two or more first electrodes of a first substrate that includes a circuit element, and at least two or more light-emitting elements that are joined to the at least two or more first electrodes. The first substrate includes a first wiring line to an n-th wiring line (n is an integer of 2 or more) that are formed into layers in order from the at least two or more light-emitting elements in a thickness direction of the first substrate. The first wiring line that is located in one of the layers of the first substrate nearest to the at least two or more light-emitting elements is formed at least in an interelectrode region between the adjacent first electrodes of the first substrate in a plan view.

DESCRIPTION OF THE EMBODIMENTS

Figure 1:
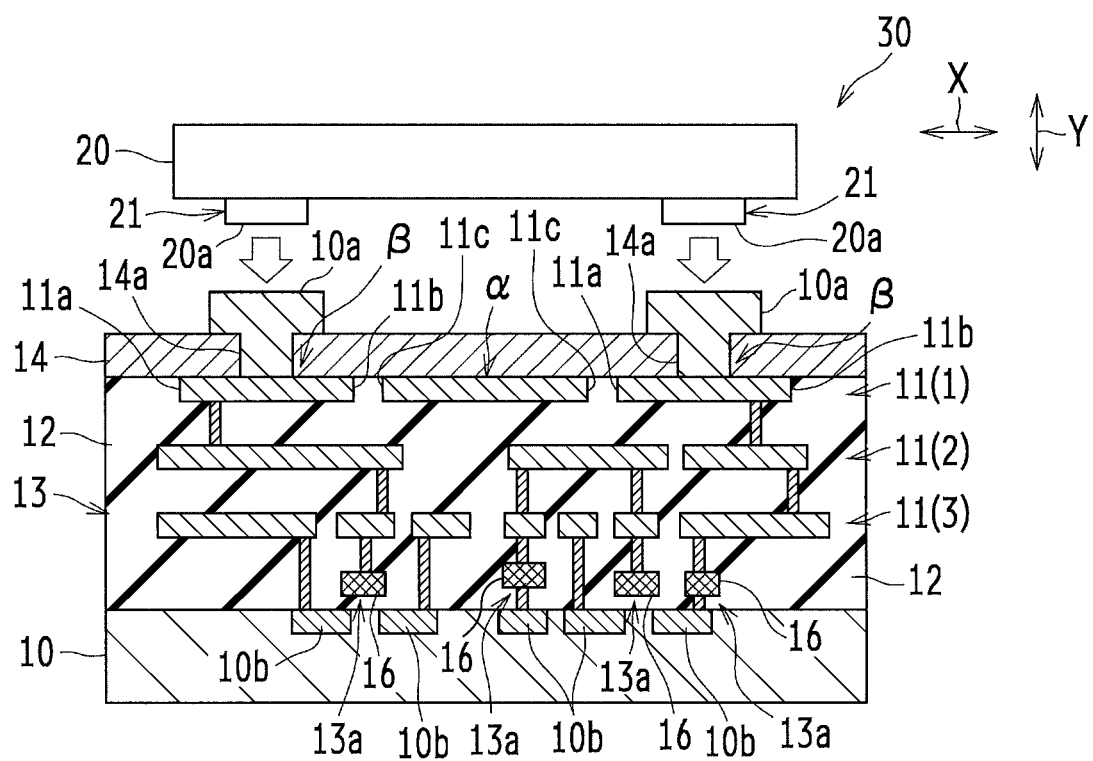
FIG. 1 schematically illustrates a state where a second substrate is bonded to a first substrate with a schematic sectional view for a light-emitting element module according to an embodiment of the present disclosure.

Embodiments of the present disclosure will hereinafter be described with reference to the drawings. In the following description, like components are designated by like reference characters. The names and functions thereof are the same. Accordingly, a detailed description thereof is not repeated.

FIG. 1 schematically illustrates a state where light-emitting elements 21 that are disposed on a second substrate 20 are bonded to a first substrate 10 with a schematic sectional view for a light-emitting element module 30 according to an embodiment of the present disclosure.

As illustrated in FIG. 1, in the light-emitting element module 30, first electrodes 10a of the first substrate 10 that includes circuit elements 13a (for example, transistors) are joined to second electrodes 20a of the light-emitting elements 21 that are disposed on the second substrate 20. Examples of the second substrate 20 include substrates (such as a sapphire substrate and a silicon substrate) for forming the light-emitting elements, a film (for example, a PET film) for protecting the light-emitting elements from being damaged by a jig when the light-emitting elements are bonded, and a film or a jig for securing the light-emitting elements to predetermined locations when the light-emitting elements are bonded at the same time.

The first substrate 10 includes a protective layer 14, layers of first wiring lines 11(1) to n-th wiring lines 11(n) (n is an integer of 2 or more; in this example, n=3), the circuit elements 13a, and terminals 10b of a circuit 13 that are formed in this order in the thickness direction Y of the first substrate 10 from the second substrate 20 toward the first substrate 10 near the second substrate 20 or the light-emitting elements 21. In some cases in the following description, n is 3.

Interlayer insulating layers 12 are disposed between the first substrate 10 and the protective layer 14. That is, the interlayer insulating layers 12 are formed between the wiring lines of the first wiring lines 11(1) to the third wiring lines 11(3), between the adjacent wiring lines in the thickness direction Y of the first wiring lines 11(1) to the third wiring lines 11(3), and between the third wiring lines 11(3) and the first substrate 10.

The second substrate 20 includes the light-emitting elements 21. The second electrodes 20a of the light-emitting elements 21 are formed near the first substrate 10.

Specifically, the first substrate 10 includes the circuit 13 (for example, a LSI circuit) that includes the circuit elements 13a.

The first wiring lines 11(1) that are located in one of the layers of the first substrate 10 nearest to the second substrate 20 or the light-emitting elements 21 are formed at least in an interelectrode region α between the adjacent second electrodes 20a in a plan view. The plan view means a view when the first substrate 10 is viewed from a surface of the second substrate 20.

The first wiring lines 11(1) are formed not only in the interelectrode region α between the second electrodes 20a but also in electrode regions β that contain the second electrodes 20a in a plan view.

According to the present embodiment, the first wiring lines 11(1) that are located in the layer of the first substrate 10 nearest to the light-emitting elements 21 are formed at least in the interelectrode region α between the adjacent second electrodes 20a in a plan view. This decreases the area of at least a space in which no first wiring lines 11(1) are disposed between the adjacent second electrodes 20a. That is, this increases an area occupied by the first wiring lines 11(1) in the direction X (horizontal direction) perpendicular to the thickness direction Y of the first substrate 10. Consequently, a stress that is applied to the first substrate 10 due to the load when the first substrate 10 and the light-emitting elements 21 are joined to each other can be decreased. Accordingly, a failure (for example, the circuit 13 of the first substrate 10 is broken) can be effectively inhibited from occurring due to the load when the first substrate 10 and the light-emitting elements 21 are joined to each other. In addition, a micro crack, which occurs due to a force that acts in the direction X (horizontal direction) perpendicular to the thickness direction Y of the first substrate 10, can be inhibited. Consequently, uniformity (for example, color uniformity) of the amount of reflected light when the light-emitting elements 21 emit light can be improved. These are effective particularly in the case where the area of each second electrode 20a of the light-emitting elements 21 is small and the number of connections with the first electrodes 10a of the first substrate 10 is large (for example, in the case where the area of each second electrode 20a of the second substrate 20 is less than 10 square micrometres, the second substrate 20 includes a plurality of the light-emitting elements 21, and the number of connections with the first electrodes 10a of the first substrate 10 is 50,000 or more).

Representative examples of the first wiring lines 11(1) to the n-th wiring lines 11(n) include metal wiring lines but are not limited thereto.

Figure 2:
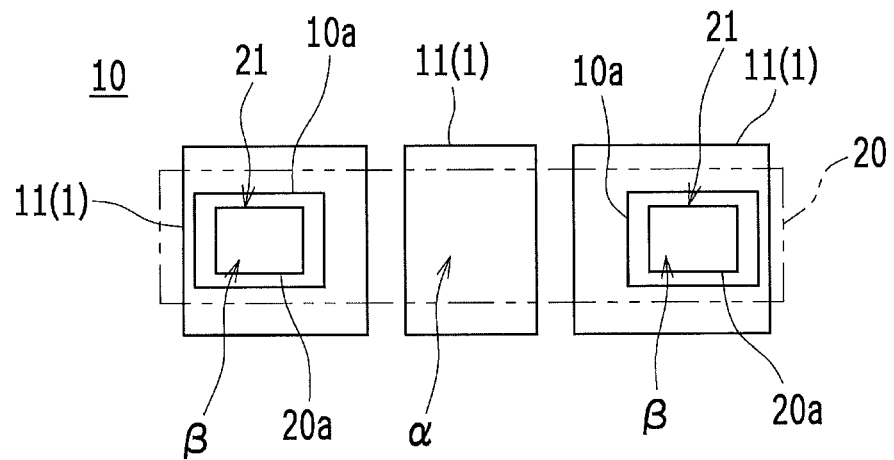
FIG. 2 illustrates a schematic plan view of an example of first wiring lines of the first substrate together with a schematic plan view of the second substrate.
Figure 3:
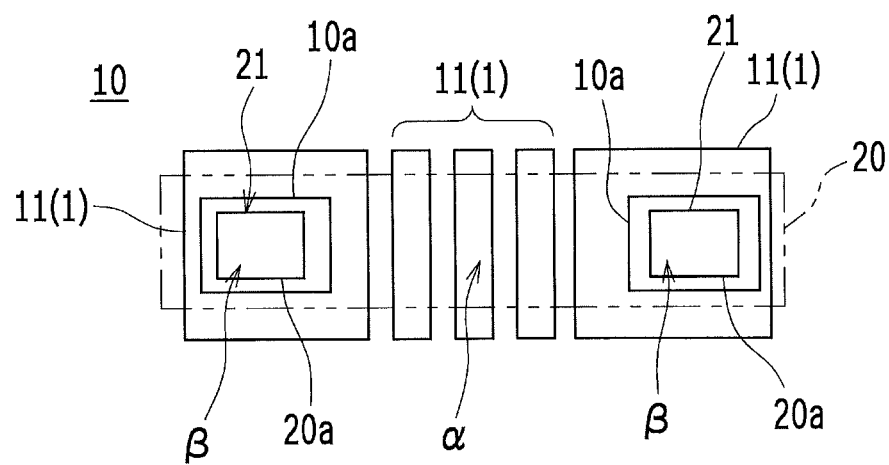
FIG. 3 illustrates a schematic plan view of another example of the first wiring lines of the first substrate together with a schematic plan view of the second substrate.

FIG. 2 illustrates a schematic plan view of an example of the first wiring lines 11(1) of the first substrate 10 together with a schematic plan view of the second substrate 20. FIG. 3 illustrates a schematic plan view of another example of the first wiring lines 11(1) of the first substrate 10 together with a schematic plan view of the second substrate 20.

The first lines 11(1) may be formed in a simple shape (see FIG. 2) or may be divided into pieces so as to have a line and space (L & S) shape (see FIG. 3). The L & S shape has stripes spaced apart from each other. In this example, the first wiring lines 11(1) that are formed into the L & S shape extend in the direction perpendicular or substantially perpendicular to the direction in which the electrodes are adjacent to each other, and are spaced apart from each other in the direction in which the electrodes are adjacent to each other.

The first wiring lines 11(1) to the n-th wiring lines 11(n) are not Limited to metal wiring lines and can be wiring lines of another layers (such as gate polysilicon layers).

The metal wiring lines and the gate polysilicon layers (GP layers) may be disposed as resistors or capacitors. For example, the gate polysilicon layers and diffusion layers may be formed, the resistors (GP resistors) of the gate polysilicon layers and the resistors (diffusion resistors) of the diffusion layers may function as a protection element against an external breakdown factor such as ESD (Electro-Static Discharge) that occurs when the first substrate 10 and the Light-emitting elements 21 are bonded to each other.

The shape of the first electrodes 10a and the second electrodes 20a is not particularly limited and may be a rectangular shape (a square shape or a rectangular shape), a circular shape, or an elliptic shape in a plan view.

The first wiring lines 11(1) preferably have a light-reflection function of reflecting light from the light-emitting elements 21. The light-reflection function improves efficiency of extraction of light from the light-emitting elements 21 in the direction from the first substrate 10 toward the second substrate 20 or the light-emitting elements. This will now be described with reference to FIG. 4 to FIG. 7.

Figure 4:
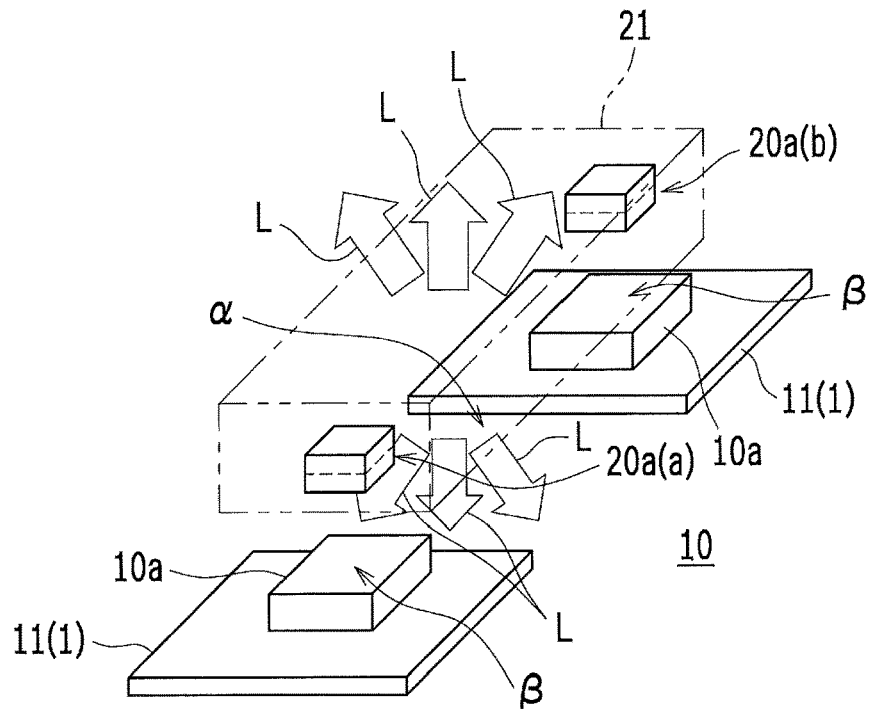
FIG. 4 is a schematic perspective view of an example of a structure that includes first wiring lines and a light-emitting element that includes two second electrodes.
Figure 5:
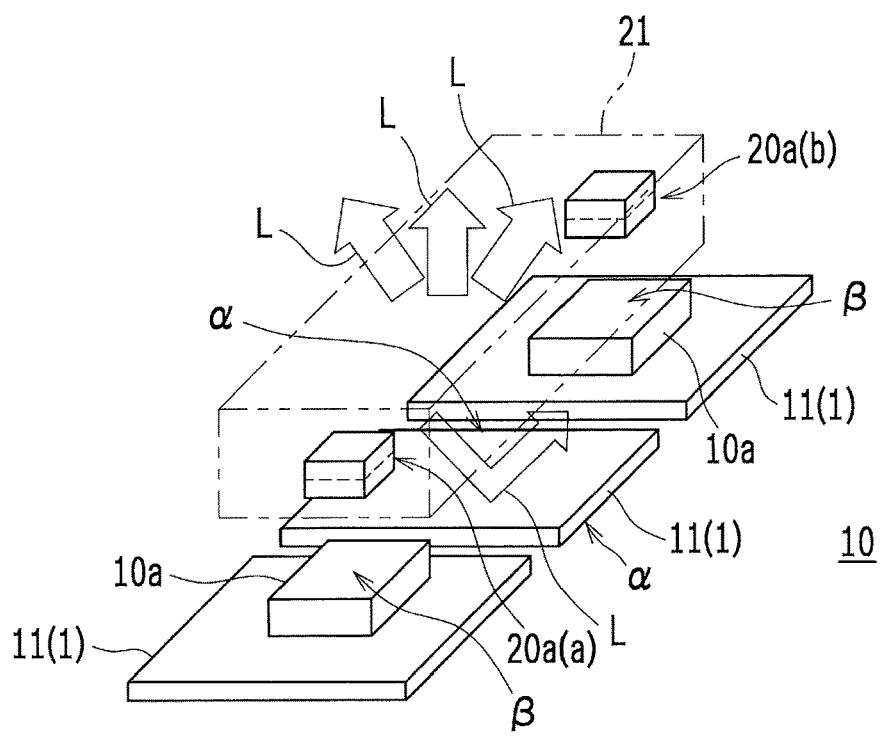
FIG. 5 is a schematic perspective view of another example of the structure of the first wiring lines and the light-emitting element that includes the two second electrodes.
Figure 6:
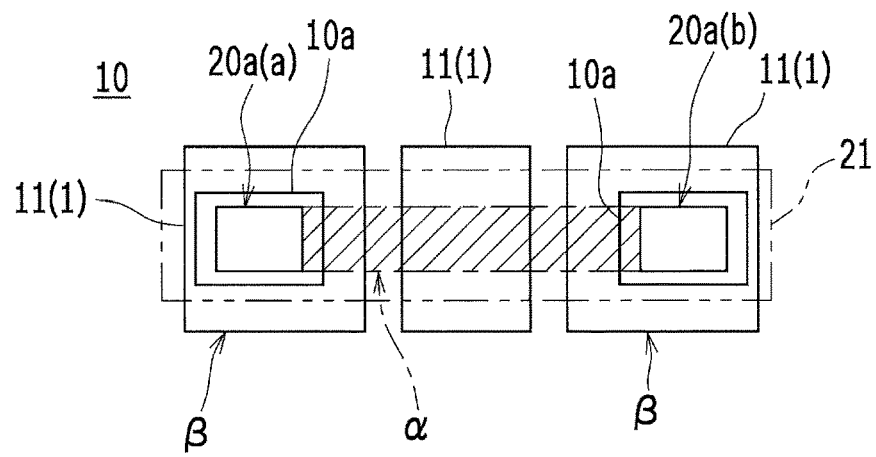
FIG. 6 is a schematic plan view of the light-emitting element that includes the two second electrodes and schematically illustrates the areas of the first wiring lines with respect to an interelectrode region between the two second electrodes.
Figure 7:
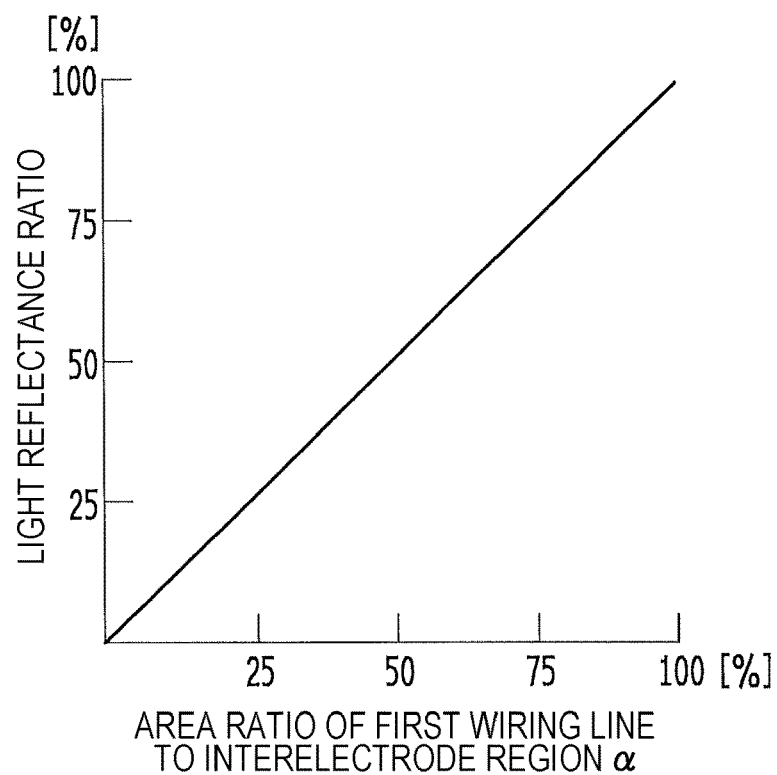
FIG. 7 is a graph illustrating a relationship between a light reflectance ratio and an area ratio of the first wiring lines to the interelectrode region of the light-emitting element that includes the two second electrodes.

FIG. 4 illustrates a schematic perspective view of an example of a structure that includes first wiring lines 11(1), a second electrode 20a(a) (anode electrode), and a second electrode 20a(b) (cathode electrode) in the case where one of the light-emitting elements 21 includes two second electrodes 20a (for example, the anode and cathode of a LED). The two second electrodes 20a(a) and 20a(b) correspond to the anode and cathode of the light-emitting element 21. Since the electrodes are disposed on one side, the first substrate 10 and the light-emitting element 21 can be electrically connected at one time when the first substrate 10 and the light-emitting element 21 are joined to each other. FIG. 5 illustrates a schematic perspective view of another example of the structure that includes the first wiring lines 11(1) and the second electrodes 20a(a) and 20a(b) in the case where the light-emitting element 21 includes the two second electrodes 20a. FIG. 6 schematically illustrates the areas of the first wiring lines 11(1) with respect to the interelectrode region α between the two second electrodes 2a(a) and 20a(b) in the case where the light-emitting element 21 includes the two second electrodes. In FIG. 6, the interelectrode region α between the second electrodes 2a(a) and 20a(b) is illustrated by hatching. FIG. 7 is a graph illustrating a relationship between a light reflectance ratio and the area ratio of the first wiring lines 11(1) to the interelectrode region α illustrated in FIG. 6. In FIG. 7, the horizontal axis represents the area ratio of the first wiring lines 11(1) to the interelectrode region α. The area ratio is a ratio of an area occupied by the first wiring lines 11(1) in the interelectrode region α to the area of the interelectrode region α and is expressed by percent. The vertical axis represents the light reflectance ratio. The light reflectance ratio is a ratio of the light reflectance of the first wiring lines 11(1) to a light reflectance in a state where the area ratio of the first wiring lines 11(1) to the interelectrode region α is regarded as 100 and expressed by percent.

As illustrated in FIG. 4 and FIG. 5, light L that is emitted from the light-emitting element travels not only in the direction toward the first substrate 10 but also in the direction opposite the direction toward the first substrate 10 in some cases. The light that travels in the direction toward the first substrate 10 is partly absorbed by the first substrate 10. Accordingly, the structure illustrated in FIG. 4 leads to a decrease in light-extraction efficiency. According to the present embodiment, as illustrated in FIG. 5, the first wiring lines 11(1) may have the light-reflection function of reflecting the light L from the light-emitting element 21. In this case, the light L that travels in the direction toward the surface of the first substrate 10 facing the second substrate 20 is reflected by the first wiring lines 11(1) and travels in the direction opposite the direction toward the surface of the first substrate 10 facing the second substrate 20, and the light-extraction efficiency increases.

As illustrated in FIG. 7, the light reflectance ratio and the area ratio of the first wiring lines 11(1) to the interelectrode region α are in proportion to each other. Accordingly, the area of the first wiring lines 11(1) in the interelectrode region α (see FIG. 6) between the second electrodes 20a(a) and 20a(b) is preferably increased as much as possible to improve the light-extraction efficiency by extracting the light. It that travels in the direction toward the first substrate 10 to the second substrate 20. This enables the light-extraction efficiency to be improved.

The first wiring lines 11(1) have a heat-dissipation function of transferring heat from the light-emitting elements 21. Accordingly, the temperature of the light-emitting element module 30 can be inhibited from being increased by the light-emitting elements 21. This will now be described with reference to FIG. 8 and FIG. 9.

Figure 8:
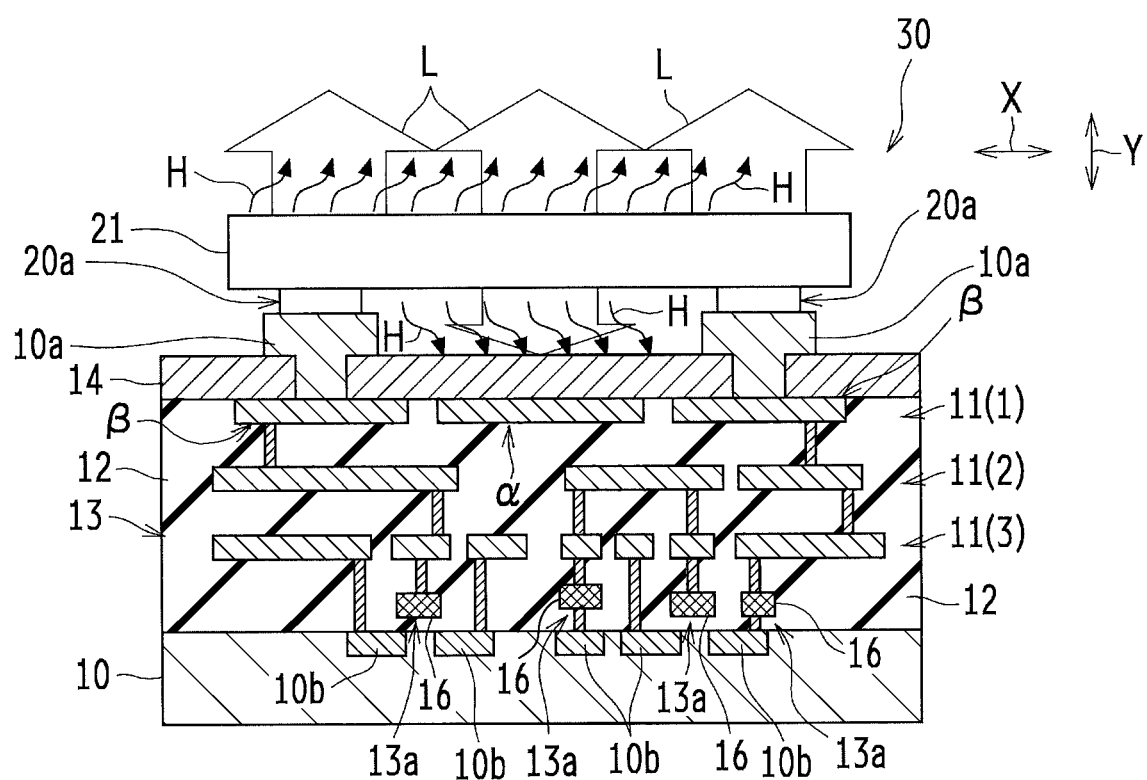
FIG. 8 is a schematic sectional view of the light-emitting element module illustrated in FIG. 1 and schematically illustrates the flow of heat around the light-emitting element that includes the two second electrode.
Figure 9:
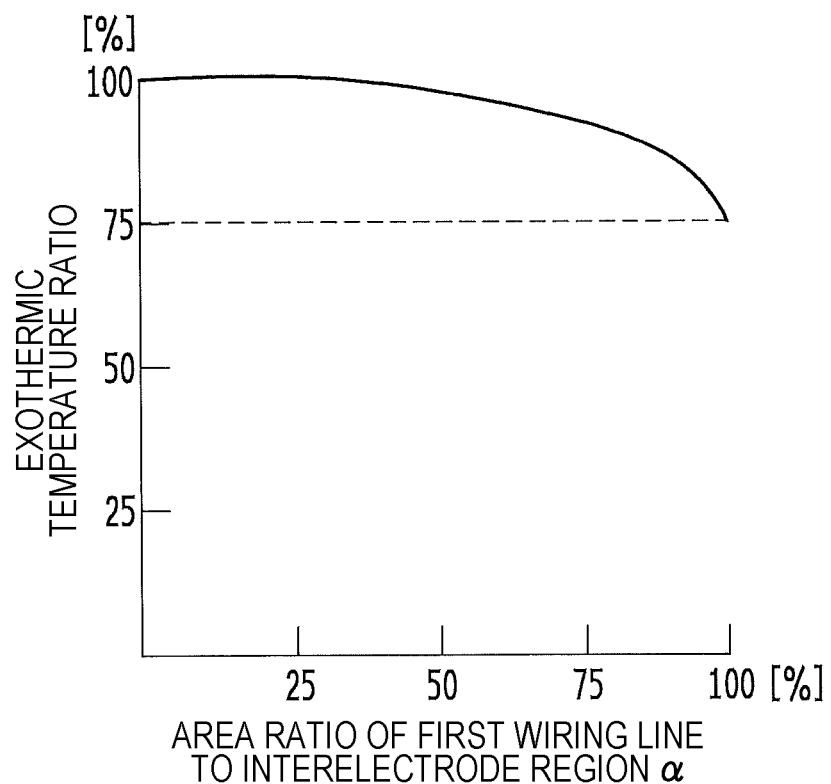
FIG. 9 is a graph illustrating a relationship between an exothermic temperature ratio and the area ratio of the first wiring lines to the interelectrode region.

FIG. 8 is a schematic sectional view of the light-emitting element module 30 illustrated in FIG. 1 and schematically illustrates the flow of heat H around the light-emitting element 21 that includes the two second electrodes 20a. FIG. 9 is a graph illustrating a relationship between an exothermic temperature ratio and the area ratio of the first wiring lines 11(1) to the interelectrode region α. In FIG. 9, the horizontal axis represents the area ratio of the first wiring lines 11(1) to the interelectrode region α. The area ratio is equal to the value in FIG. 7. The vertical axis represents the exothermic temperature ratio. The exothermic temperature ratio is a ratio of the exothermic temperature of the light-emitting elements 21 to the exothermic temperature of the light-emitting elements 21 that is affected by the first wiring lines 11(1) in a state where the area ratio of the first wiring lines 11(1) to the interelectrode region α is regarded as 100, and is expressed by percent.

As illustrated in FIG. 8, the light-emitting elements 21 emit the light L and generate heat by themselves. The first wiring lines 11(1) have the heat-dissipation function of transferring the heat from the light-emitting elements 21 to the outside. It goes without saying that there may be no structure (heat dissipation path) to actively transfer the heat to the outside, provided that the heat-dissipation function enables the heat from the light-emitting elements 21 to be absorbed (the heat of the light-emitting elements 21 to be dissipated). Accordingly, for example, in the case where the first wiring lines 11(1) are not formed in the interelectrode region α between the second electrodes 20a in a plan view, the temperature of the light-emitting element module 30 is likely to increase, and the reliability of the light-emitting element module 30 decreases accordingly.

As illustrated in FIG. 9, the exothermic temperature ratio and the area ratio of the first wiring lines 11(1) to the interelectrode region α are in inverse proportion to each other. Accordingly, the area of the first wiring lines 11(1) in the interelectrode region α (see FIG. 6) between the second electrodes 20a is preferably increased as much as possible in order for the first wiring lines 11(1) to serve as a heat sink to inhibit the temperature of the light-emitting element module 30 from increasing due to the heat that is generated by the light-emitting elements 21 by themselves and to inhibit the reliability of the light-emitting element module 30 from decreasing. Consequently, the temperature of the light-emitting element module 30 can be inhibited from increasing and the light-emitting element module 30 can have high reliability accordingly.

For example, the area ratio of the first wiring lines 11(1) to the interelectrode region α between the second electrodes 20a in a plan view is preferably 25% or more, more preferably 50% or more, further preferably 75% or more.

The first wiring lines 11(1) can be connected to the terminals 10b of the circuit 13 of the first substrate 10. This enables a path for the heat H to the first substrate 10 to be ensured. Consequently, the heat H can effectively escape from the first substrate 10, and the temperature of the light-emitting element module 30 can be further inhibited from increasing.

First Embodiment

According to the present embodiment, the circuit elements 13a of the first substrate 10 may be disposed in an overlap region in which the first electrodes 10a of the first substrate 10 overlap the second electrodes 20a of the light-emitting elements 21.

According to the present embodiment, the protective layer 14 (see FIG. 1) may be formed as the outermost surface of the first substrate 10 facing the light-emitting elements 21. The protective layer 14 has openings 14a. The first electrodes 10a of the first substrate 10 that are joined to the second electrodes 20a of the light-emitting elements 21 extend through the openings 14a. Each second wiring line 11(2) that is located in the layer adjacent to the first wiring lines 11(1) that are connected to the first electrodes 10a overlaps at least one of end portions of a corresponding one of the first wiring lines 11(1) in a plan view. That is, the second wiring line 11(2) overlaps both end portions 11a and 11b of the corresponding first wiring line 11(1), the end portion 11a, or the other end portion 11b in a plan view. The second wiring line 11(2) may extend to an end portion 11c of the first wiring line 11(1) adjacent to the corresponding first wiring line 11(1).

In this way, the breakdown resistance of the circuit 13 of the first substrate 10 can be improved. In addition, a micro crack, which occurs due to a force that acts in the thickness direction Y (vertical direction) of the first substrate 10, can be inhibited.

Figure 10:
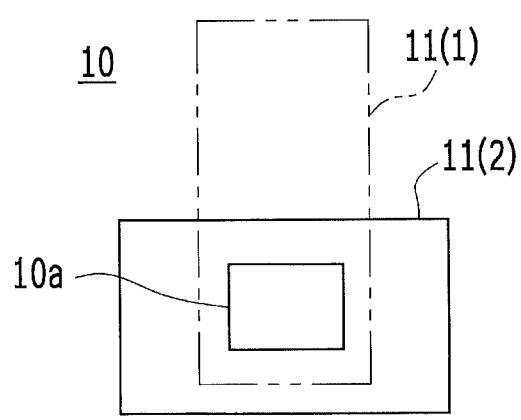
FIG. 10 is a schematic plan view of an example of a second wiring line that overlaps at least an end portion of a corresponding one of the first wiring lines in a plan view of the first substrate.
Figure 11:
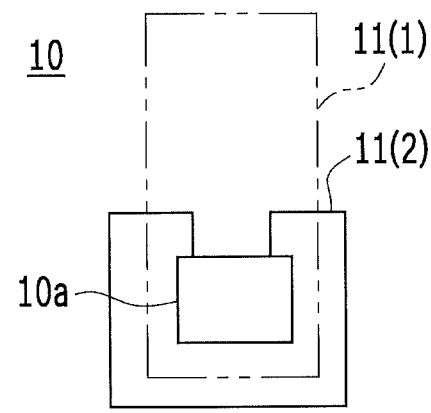
FIG. 11 is a schematic plan view of another example of the second wiring line that overlaps at least the end portion of the first wiring line in a plan view of the first substrate.
Figure 12:
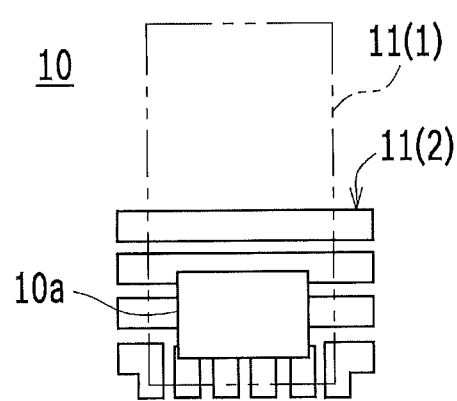
FIG. 12 is a schematic plan view of another example of the second wiring lines that overlap at least the end portion of the first wiring line in a plan view of the first substrate.

FIG. 10 is a schematic plan view of an example of one of the second wiring lines 11(2) that overlaps the corresponding first wiring line 11(1) of the first substrate 10. FIG. 11 is a schematic plan view of another example of the second wiring line 11(2) that overlaps the first wiring line 11(1) of the first substrate 10. FIG. 12 is a schematic plan view of another example of the second wiring line 11(2) that overlaps the first wiring line 11(1) of the first substrate 10.

As illustrated in FIG. 10 to FIG. 12, the second wiring line 11(2) intersect with the first wiring line 11(1) (at right angles or at substantially right angles). The second wiring line 11(2) preferably has the same width or substantially the same width as the first wiring line 11(1) in a plan view. The second wiring line 11(2) may have a simple shape (see FIG. 10) or may have a notch (see FIG. 11). The second wiring lines 11(2) may have a line and space (L & S) shape (see FIG. 12).

Second Embodiment

According to the present embodiment, n may be 10 or less (in this example, n=3, and there may be the gate polysilicon layers and/or the diffusion layers in addition to the wiring lines. At least one of the first wiring lines 11(1) to the n-th wiring lines may be connected to a corresponding one of resistors 16 that are formed in the gate polysilicon layers and/or the diffusion layers.

According to the present embodiment, the resistors 16 may be connected to a gate electrode of the first substrate 10. The resistors 16 may be connected to the first electrodes 10a of the first substrate 10.

In this way, a protection circuit can be formed to deal with the external breakdown factor such as ESD that occurs when the first substrate 10 and the light-emitting elements 21 are bonded to each other.

According to the present embodiment, the gate polysilicon layers and/or the diffusion layers may be connected to the gate electrode.

In this way, the protection circuit can be readily achieved with a simple structure that includes the gate polysilicon layers and/or the diffusion layers to deal with the external breakdown factor such as ESD.

Third Embodiment

In the case where the second substrate 20 is composed of a material through which visible light passes, the first wiring lines 11(1) that are arranged in rows in a plane of the first substrate 10 can be observed from a plane through the second substrate 20 that faces the first wiring lines 11(1).

Figure 13:
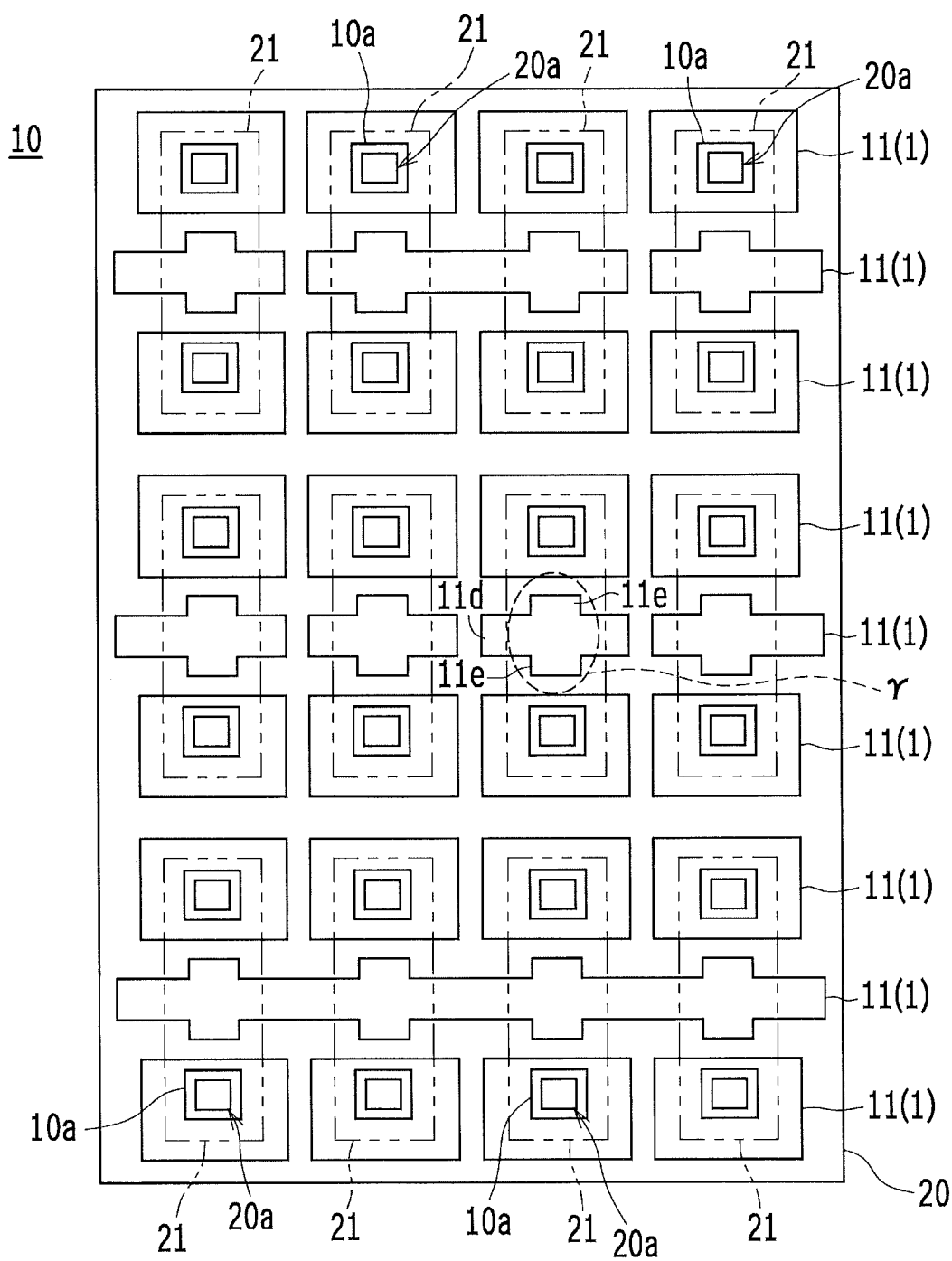
FIG. 13 is a schematic plan view of a structure that Includes the light-emitting elements each of which includes the two second electrodes and arranged in rows in relation to the first wiring lines that are arranged in rows in a plane of the first substrate in an exemplary manner.

FIG. 13 is a schematic plan view of a structure that includes the light-emitting elements 21 each of which includes the two second electrodes 20a and arranged in rows in relation to the first wiring lines 11(1) that are arranged in rows in a plane of the first substrate 10 in an exemplary manner.

According to the present embodiment, as illustrated in FIG. 13, an indicator γ is disposed at a predetermined position on each first wiring line 11(1). In this example, the indicator γ includes projections lie that project from at least one side (specifically, both sides) of a body 11d of the first wiring line 11(1) in the direction intersecting with (perpendicular to or substantially perpendicular to) the longitudinal direction of the body 11d.

In this way, the indicator γ can be used as a sign (mark). The sign can be used to set the position of the first substrate 10 (the first electrodes 10a) and the position of the second substrate 20 (the second electrodes 20a) when the second substrate 20 is bonded to the first substrate 10. This enables the positions of the second substrate 20 and the first substrate 10 to be more accurately set.

Fourth Embodiment

Figure 14:
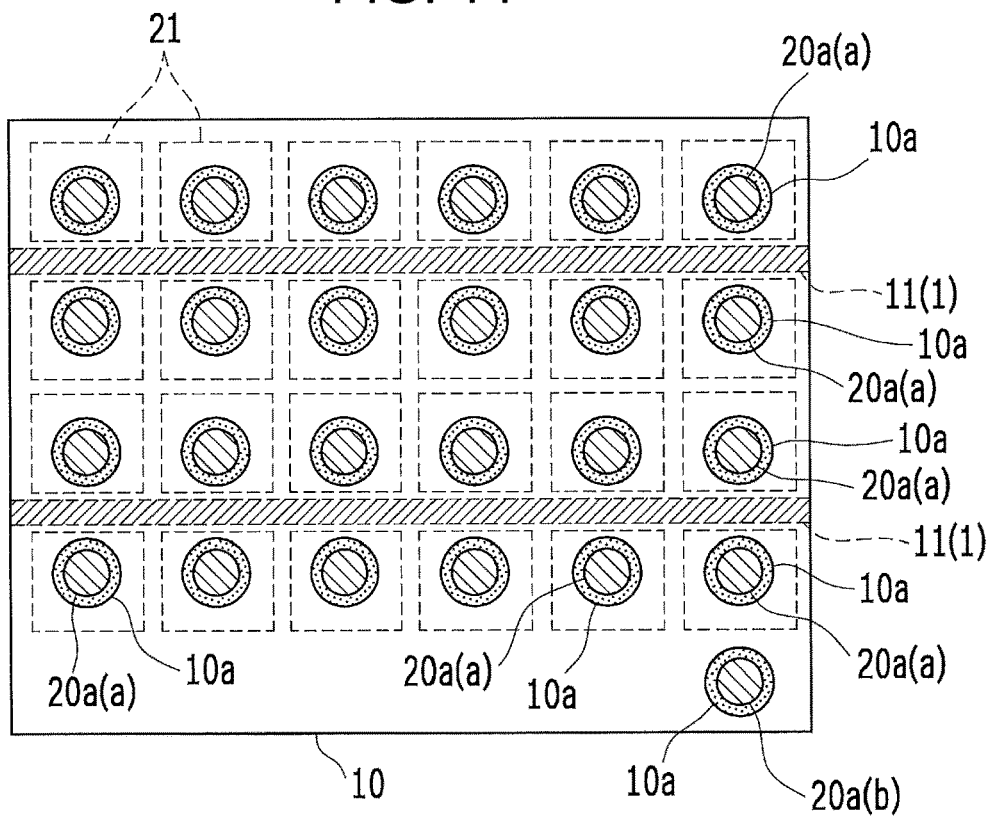
FIG. 14 is a schematic plan view of a structure in which the first substrate includes the first electrodes that are arranged in rows in a plane thereof, some of the second electrodes are arranged in rows in relation to the first wiring lines that are arranged between the corresponding first electrodes in an exemplary manner, and the other second electrode is disposed as a single common electrode.
Figure 15:
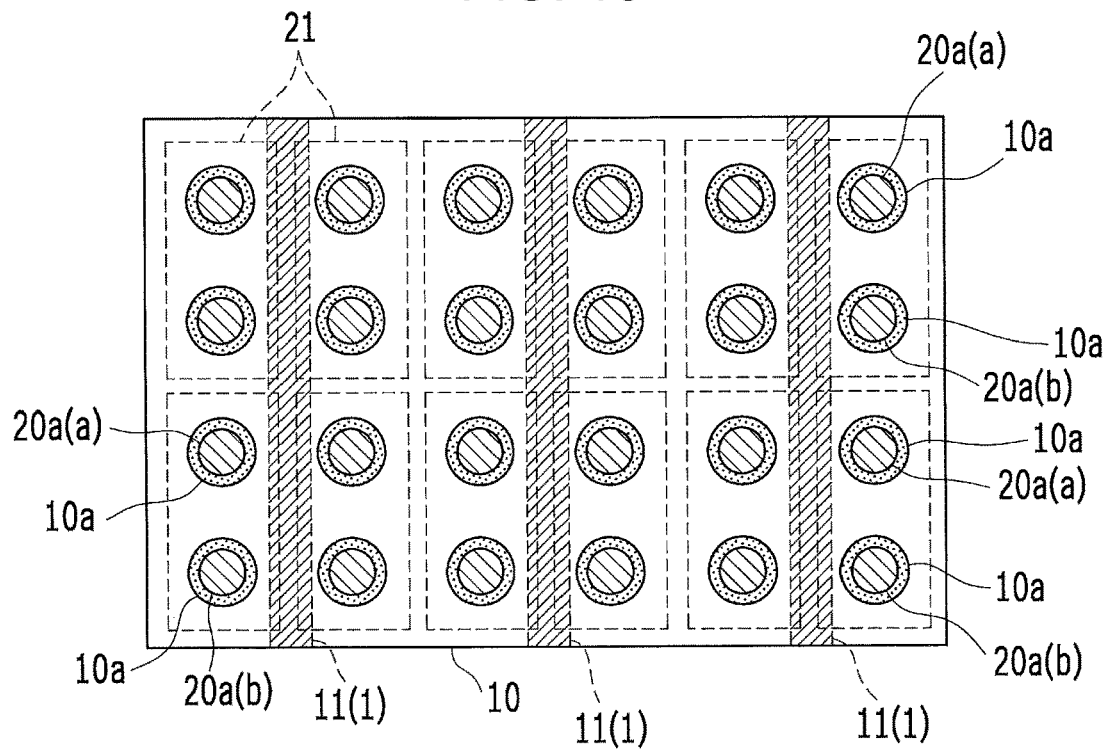
FIG. 15 is a schematic plan view of a structure in which the first substrate includes the first electrodes that are arranged in rows in a plane thereof, and the light-emitting elements each of which includes the two second electrodes are arranged in rows in relation to the first wiring lines that are arranged between the corresponding first electrodes in another exemplary manner.
Figure 16:
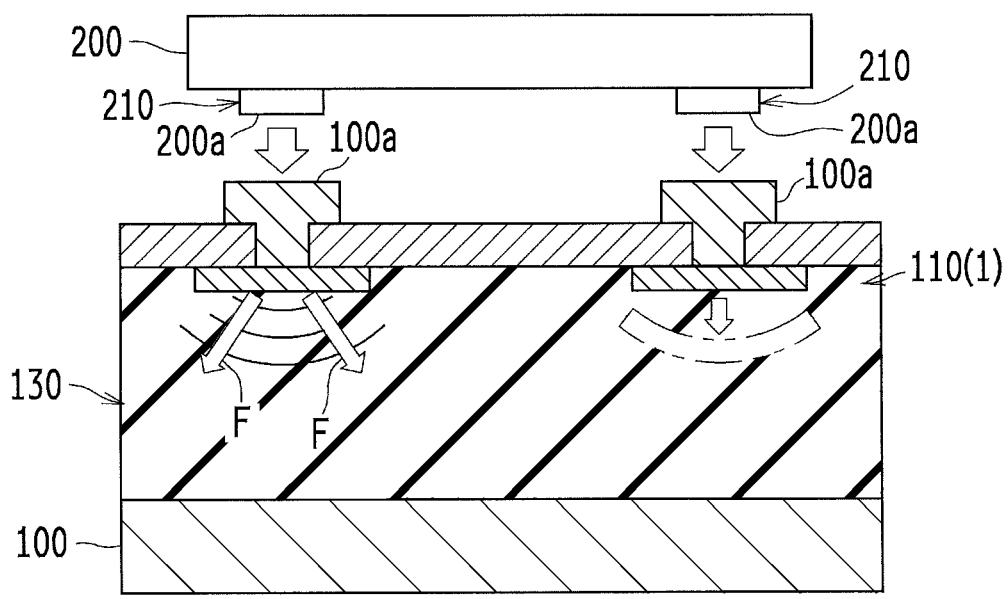
FIG. 16 schematically illustrates a state where a pressure is applied to each first wiring line when a second substrate is bonded to a first substrate with a schematic sectional view.
Figure 17:
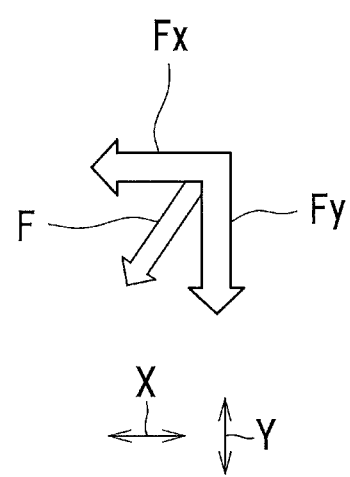
FIG. 17 illustrates a pressure resolution diagram in which the pressure that is applied to the first wiring line is resolved.
Figure 18:
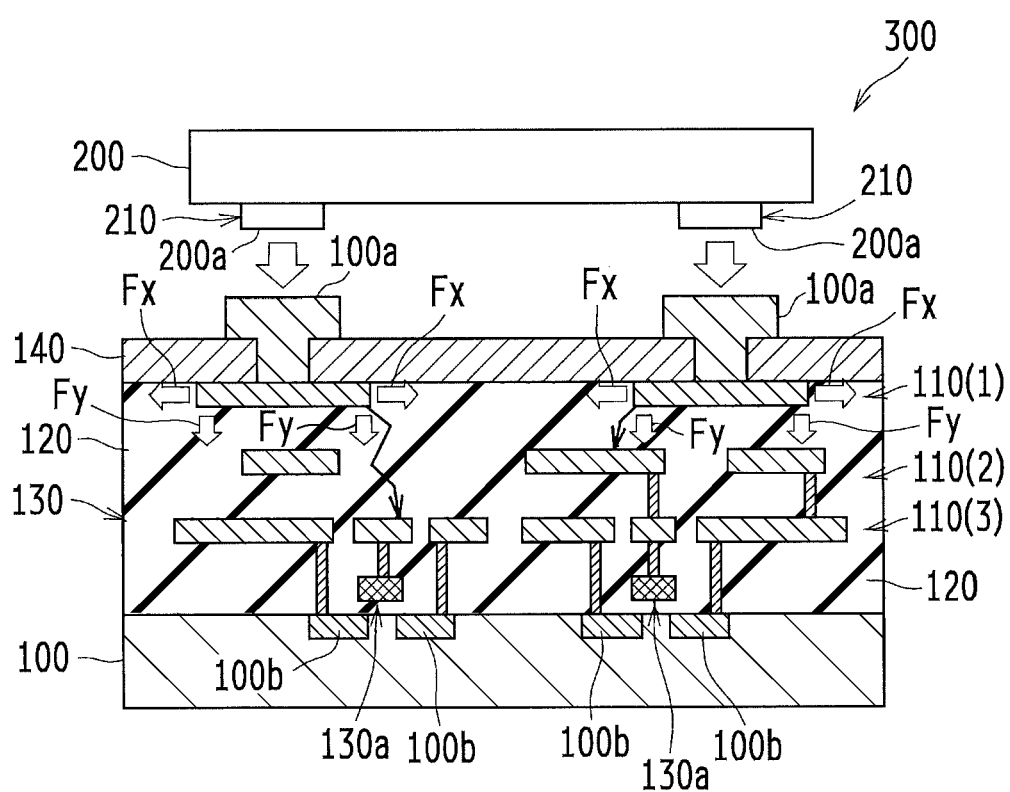
FIG. 18 schematically illustrates a state where the second substrate is bonded to the first substrate with a schematic sectional view for an existing light-emitting element module.

FIG. 14 is a schematic plan view of a structure in which the first substrate 10 includes the first electrodes 10a that are arranged in rows in a plane thereof, some of the second electrodes 20a(a) are arranged in rows in relation to the first wiring lines 11(1) that are arranged between the corresponding first electrodes 10a in an exemplary manner, and the other second electrode 20a(b) is disposed as a single common electrode. FIG. 15 is a schematic plan view of a structure in which the first substrate 10 includes the first electrodes 10a that are arranged in rows in a plane thereof, and the light-emitting elements 21 each of which includes the two second electrodes 20a are arranged in rows in relation to the first wiring lines 11(1) that are arranged between the corresponding first electrodes 10a in another exemplary manner.

In FIG. 14, a common electrode structure of the light-emitting elements 21 includes the second electrodes 20a(a) that are arranged in a 4×6 matrix and the other second electrode 20a(b) that is separated from a matrix region. In FIG. 14, the first wiring lines 11(1) extend in the horizontal direction (longitudinal direction) between the corresponding first electrodes 10a. In FIG. 15, the first wiring lines 11(1) extend in the vertical direction (transverse direction) between the corresponding light-emitting elements 21.

The present embodiment is not particularly limited to the layout of the light-emitting elements 21 and/or the electrode structure, provided that the first wiring lines 11(1) are located between the corresponding first electrodes 10a of the first substrate 10 to which the light-emitting elements 21 are joined as illustrated in FIG. 14 and FIG. 15.

For example, in FIG. 14, the first wiring lines 11(1) extend in the horizontal direction (longitudinal direction). However, goes without saying that the first wiring lines 11(1) may extend in the vertical direction (transverse direction) as illustrated in FIG. 15. It goes without saying that, in FIG. 14, the other second electrode 20a(b) may be formed on the back (display surface) of one of the electrodes 20a(a) instead of the other second electrode 20a(b) that is separated therefrom.

Other Embodiments

The light-emitting element module 30 described according to the present embodiment may include a damage detection circuit. The damage detection circuit is typically disposed in a region of the light-emitting element module 30 to which a pressure is applied and can detect whether an abnormal stress is applied to the light-emitting element module 30. For example, the damage detection circuit can break by itself before a pressure of a predetermined magnitude or more (for example, a pressure at which the circuit 13 is broken) is applied thereto. The light-emitting elements 21 may emit light of different colors. The light-emitting elements 21 for the respective colors can be disposed on the second substrate 20, and connection with the first substrate 10 can be repeated. The second substrate 20 can be removed after the first electrodes 10a and the second electrodes 20a are joined to each other.

The present disclosure is not limited to the embodiments described above and can be carried out in various embodiments. Accordingly, the embodiments are described by way of example in all aspects and are not restrictive. The scope of the present disclosure is shown by claims and is not restricted by the above description. The scope of the present disclosure includes all modification and alterations within the same scope as the claims.

The present disclosure contains subject matter related to that disclosed in Japanese Priority Patent Application JP 2018-084447 filed in the Japan Patent Office on Apr. 25, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting element module comprising:
at least two or more first electrodes of a first substrate that includes a circuit element; and
at least two or more light-emitting elements that are joined to the at least two or more first electrodes,
wherein the first substrate further includes a first wiring line to an n-th wiring line (n is an integer of 2 or more) that is formed into layers in order from the at least two or more light-emitting elements in a thickness direction of the first substrate,
wherein the first wiring line that is located in one of the layers of the first substrate nearest to the at least two or more light-emitting elements is formed at least in an interelectrode region between the adjacent first electrodes of the first substrate in a plan view, and
wherein a protective layer is formed as an outermost surface of the first substrate near the at least two or more light-emitting elements, the protective layer has an opening, the at least two or more first electrodes of the first substrate that are joined to second electrodes of the at least two or more light-emitting elements extend through the opening, and a second wiring line that is located in a layer adjacent to the first wiring line that is connected to the at least two or more first electrodes overlaps at least one of end portions of the first wiring line in a plan view.

2. The light-emitting element module according to claim 1,
wherein the first wiring line of the first substrate has a light-reflection function of reflecting light from the at least two or more light-emitting elements and a heat-dissipation function of dissipating heat from the at least two or more light-emitting elements.

3. The light-emitting element module according to claim 1,
wherein the circuit element of the first substrate is disposed in an overlap region in which the at least two or more first electrodes of the first substrate overlap the second electrodes of the at least two or more light-emitting elements.

4. A light-emitting element module comprising:
at least two or more first electrodes of a first substrate that includes a circuit element; and
at least two or more light-emitting elements that are joined to the at least two or more first electrodes,
wherein the first substrate further includes a first wiring line to an n-th wiring line (n is an integer of 2 or more) that is formed into layers in order from the at least two or more light-emitting elements in a thickness direction of the first substrate,
wherein the first wiring line that is located in one of the layers of the first substrate nearest to the at least two or more light-emitting elements is formed at least in an interelectrode region between the adjacent first electrodes of the first substrate in a plan view, and
wherein the n is 10 or less, at least one of a gate polysilicon layer and a diffusion layer is formed in addition to the layers of the wiring lines, and at least one of the first wiring line to the n-th wiring line is connected to a resistor that is formed in the at least one of the gate polysilicon layer and the diffusion layer.

5. The light-emitting element module according to claim 4,
wherein the resistor is connected to a gate electrode of the first substrate.

6. The light-emitting element module according to claim 4,
wherein the resistor is connected to one of the at least two or more first electrodes of the first substrate.

* * * * *